(12) United States Patent
Chen et al.

(10) Patent No.: US 12,595,548 B2
(45) Date of Patent: Apr. 7, 2026

(54) DOPED NICKEL OXIDE TARGET AND PREPARATION METHOD AND APPLICATION THEREOF

(71) Applicant: CONTEMPORARY AMPEREX TECHNOLOGY (HONG KONG) LIMITED, Hong Kong (CN)

(72) Inventors: Guodong Chen, Ningde (CN); Weile Lin, Ningde (CN); Zhaohui Liu, Ningde (CN); Yongsheng Guo, Ningde (CN); Yandong Wang, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 0 days.

(21) Appl. No.: 18/193,382

(22) Filed: Mar. 30, 2023

(65) Prior Publication Data

US 2023/0235448 A1 Jul. 27, 2023

Related U.S. Application Data

(63) Continuation of application No. PCT/CN2021/134882, filed on Dec. 1, 2021.

(51) Int. Cl.
| | |
|---|---|
| *C23C 14/34* | (2006.01) |
| *C23C 4/11* | (2016.01) |
| *H01J 37/34* | (2006.01) |
| *C23C 4/134* | (2016.01) |
| *H10K 30/86* | (2023.01) |

(52) U.S. Cl.
CPC ............ *C23C 14/3414* (2013.01); *C23C 4/11* (2016.01); *H01J 37/3426* (2013.01); *C23C 4/134* (2016.01); *H01J 2237/332* (2013.01); *H10K 30/86* (2023.02)

(58) Field of Classification Search
CPC ............ C23C 14/3414; C23C 14/0036; C23C 14/085; C23C 4/11; C23C 4/134; C23C 4/10; H01J 37/3426; H01J 37/3429; H01J 2237/332; H10K 30/86; H10K 30/40; H10K 85/50; H10K 71/30; Y02E 10/549
USPC ........................................ 204/298.12, 298.13
See application file for complete search history.

(56) References Cited

U.S. PATENT DOCUMENTS

| | | | | |
|---|---|---|---|---|
| 5,427,993 A | * | 6/1995 | Perry | ................... B01J 37/0238 502/340 |
| 6,461,686 B1 | | 10/2002 | Vanderstraeten | |

(Continued)

FOREIGN PATENT DOCUMENTS

| | | |
|---|---|---|
| CN | 104451582 B | 3/2015 |
| CN | 105322026 A | 2/2016 |

(Continued)

OTHER PUBLICATIONS

Machine Translation CN 112456971 (Year: 2021).*

(Continued)

*Primary Examiner* — Rodney G McDonald
(74) *Attorney, Agent, or Firm* — ANOVA LAW GROUP, PLLC

(57) ABSTRACT

A doped nickel oxide target includes a nickel oxide substrate and a dopant doped therein. The dopant includes at least one compound that contains one or more elements of Cu, Ca, Cr, Sn, Hg, Pb, Mg, Mn, Ag, Co, and Pr.

11 Claims, 1 Drawing Sheet

(56)　　　　　References Cited

U.S. PATENT DOCUMENTS

| | | | | |
|---|---|---|---|---|
| 8,932,436 | B2 * | 1/2015 | Fanton | G02F 1/1524 |
| | | | | 204/192.15 |
| 2005/0115828 | A1 | 6/2005 | Fanton et al. | |
| 2012/0085641 | A1 * | 4/2012 | Herzog | C23C 14/3414 |
| | | | | 264/681 |
| 2012/0279856 | A1 | 11/2012 | Medvedovski et al. | |
| 2015/0329428 | A1 * | 11/2015 | Campet | C04B 35/6264 |
| | | | | 252/519.1 |

FOREIGN PATENT DOCUMENTS

| | | |
|---|---|---|
| CN | 108063186 A | 5/2018 |
| CN | 112321280 A | 2/2021 |
| CN | 112374554 A | 2/2021 |
| CN | 112441819 A | 3/2021 |
| CN | 112456971 A | 3/2021 |
| CN | 112481592 A | 3/2021 |
| CN | 112624739 A | 4/2021 |
| JP | 2000515929 A | 11/2000 |
| JP | 2005525463 A | 8/2005 |
| JP | 2012082520 A | 4/2012 |
| JP | 2012523498 A | 10/2012 |
| JP | 2013199682 A | 10/2013 |
| KR | 20200017847 A | 2/2020 |
| WO | 03014254 A1 | 2/2003 |
| WO | 2020109787 A1 | 6/2020 |

OTHER PUBLICATIONS

The World Intellectual Property Organization (WIPO) International Search Report for PCT/CN2021/134882 Jul. 27, 2022 5 pages (including English translation).

The European Patent Office (EPO) The Extended European Search Report for Application No. 21962750.2 Jan. 3, 2024 7 Pages.

The Japan Patent Office (JPO) Notice of Reasons for Refusal for Application No. 2024-528480 May 7, 2025 19 Pages (including translation).

The Korean Intellectual Property Office Request for the Submission of an Opinion for Application No. 10-2024-7015875 Dec. 2, 2025 15 Pages (including translation).

* cited by examiner

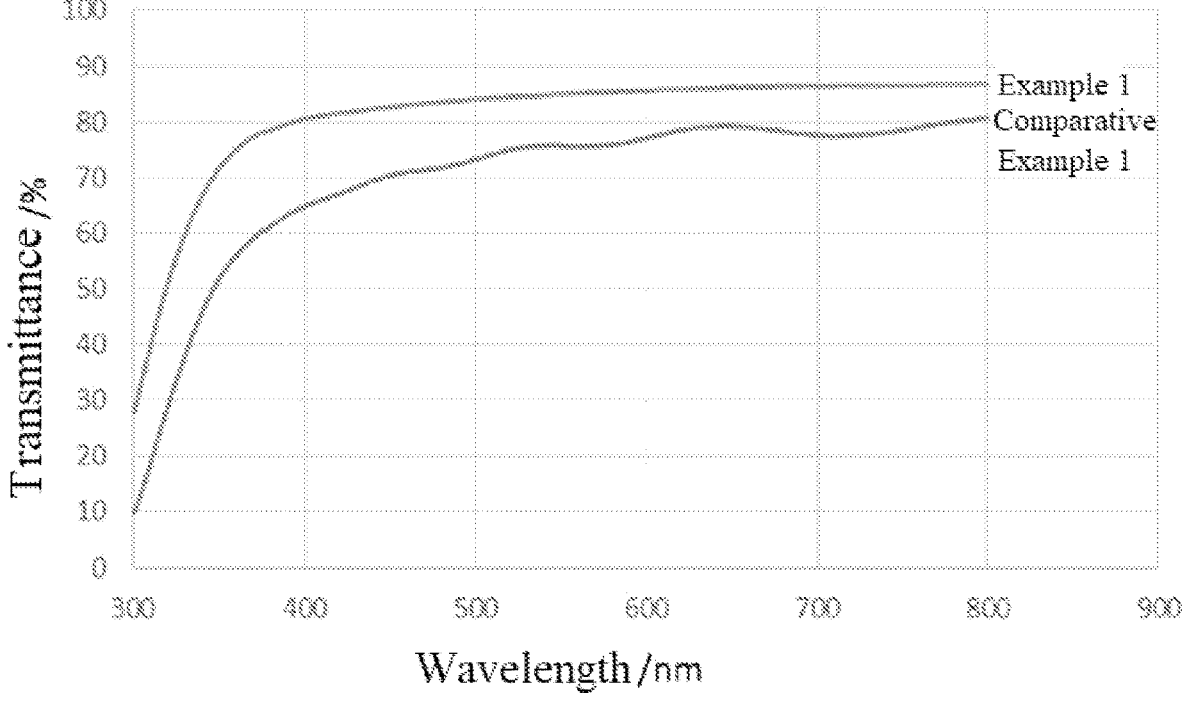

DOPED NICKEL OXIDE TARGET AND PREPARATION METHOD AND APPLICATION THEREOF

CROSS-REFERENCE TO RELATED APPLICATION

This application is a continuation of International Application No. PCT/CN2021/134882, filed Dec. 1, 2021, the entire content of which is incorporated herein by reference.

TECHNICAL FIELD

The present application relates to the technical field of targets using a sputtering process, and in particular to, a doped nickel oxide target and a preparation method and application thereof.

BACKGROUND ART

In perovskite solar batteries, efficient transport of photoinduced electrons depends on performance stability and repeatability of perovskite hole transport layers (HTL). At present, there are many materials that can be used as hole transport layers of perovskite thin-film batteries, among which nickel oxide is the most common. At present, a relatively mature technical means for preparing the hole transport layers is usually to prepare by a sputtering process using a nickel oxide target.

With the continuous improvement of performance requirements for the perovskite solar batteries, how to improve performance of the hole transport layers is the focus of current research.

SUMMARY

The present application is made in view of the above problems, and an objective of the present application is to provide a novel doped nickel oxide target to improve performance of a hole transport layer prepared using the doped nickel oxide target.

In order to achieve the above objective, the present application provides a doped nickel oxide target and a preparation method and application thereof.

A first aspect of the present application provides a doped nickel oxide target, which includes a nickel oxide substrate and a dopant doped therein, the dopant including at least one compound that contains one or more elements of Cu, Ca, Cr, Sn, Hg, Pb, Mg, Mn, Ag, Co, and Pr.

Therefore, in the present application, through doping with a specific compound, the hole transport layer of a perovskite solar battery prepared using the doped nickel oxide target of the present application has a narrower band gap and higher spectral response, and battery conversion efficiency is higher, indicating that performance of the perovskite solar battery and the hole transport layer prepared using the target of the present application is improved.

In any of embodiments, the dopant includes at least one compound of CuO, $Cu_2O$, $Cu_2S$, CuI, CuSCN, $CuGaO_2$, CoO, $Cr_2O_3$, SnO, SnS, $Hg_2O$, PbO, AgO, $Ag_2O$, MnO, and $Pr_2O_3$. The addition of the dopant is conductive to further improving performance of the hole transport layer and the battery.

In any of embodiments, the dopant includes at least two compounds of CuO, $Cu_2O$, $Cu_2S$, CuI, CuSCN, $CuGaO_2$, CoO, $Cr_2O_3$, SnO, SnS, $Hg_2O$, PbO, AgO, $Ag_2O$, MnO, and $Pr_2O_3$. The inventor unexpectedly found that performance of the battery, especially conversion efficiency thereof, is further improved when at least two of the dopants are used for doping simultaneously.

In any of embodiments, the content of the dopant in the doped nickel oxide target is 0.1 wt % to 20 wt %.

In any of embodiments, based on the total mass of the doped nickel oxide target, the content of CuO is 0 to 15%, the content of $Cu_2O$ is 0 to 15%, the content of $Cu_2S$ is 0 to 15%, the content of CuI is 0 to 20%, the content of CuSCN is 0 to 15%, the content of $CuGaO_2$ is 0 to 15%, the content of CoO is 0 to 8%, the content of $Cr_2O_3$ is 0 to 15%, the content of SnO is 0 to 15%, the content of SnS is 0 to 15%, the content of $Hg_2O$ is 0 to 15%, the content of PbO is 0 to 15%, the content of AgO is 0 to 15%, the content of $Ag_2O$ is 0 to 15%, the content of MnO is 0 to 10%, and the content of $Pr_2O_3$ is 0 to 15%; and the total content of the dopant is 0.1% to 20%.

In any of embodiments, the doped nickel oxide target is obtained by a classified plasma spraying method. In the doped nickel oxide target obtained by the method, the dopant is distributed inside the nickel oxide substrate more uniformly.

A second aspect of the present application provides a preparation method of a doped nickel oxide target, which includes:

thermally spraying a coating for binding on a back panel or back tube of a target, respectively introducing nickel oxide powder and various dopant powders into their respective plasma generation sprayers, and respectively applying the nickel oxide and dopant onto the back panel or back tube of the target by plasma spraying simultaneously, to obtain the doped nickel oxide target, wherein the dopant is selected from at least one compound that contains one or more elements of Cu, Ca, Cr, Sn, Hg, Pb, Mg, Mn, Ag, Co, and Pr.

By the method of the present application, the type and content of the dopant can be flexibly controlled, so that doped nickel oxide targets with different types and contents of dopants can be obtained. Further, the method of the present application is conductive to obtaining the doped nickel oxide target with dopant distributed more uniformly.

A third aspect of the present application further provides use of the doped nickel oxide target provided in the first aspect of the present application or the doped nickel oxide target prepared by the method provided in the second aspect of the present application in preparation of a hole transport layer of a perovskite solar battery.

The doped nickel oxide target provided in the present application includes one or more dopants, the hole transport layer of a perovskite solar battery prepared using the doped nickel oxide target of the present application has a narrower band gap and higher spectral response, and battery conversion efficiency is higher, indicating that battery performance can be improved by using the doped nickel oxide target to prepare the hole transport layer of a perovskite solar battery.

DESCRIPTION OF DRAWINGS

FIG. 1 shows spectral curves of hole transport layers prepared using a doped nickel oxide target of Example 1 and a nickel oxide target of Comparative Example 1.

DETAILED DESCRIPTION

Hereinafter, embodiments of a doped nickel oxide target and a preparation method and application thereof of the present application are described in detail and specifically disclosed with reference to the drawings as appropriate. However, there may be cases where unnecessary detailed description is omitted. For example, there are cases where detailed descriptions of well-known items and repeated descriptions of actually identical structures are omitted. This is to avoid unnecessary redundancy in the following descriptions and to facilitate the understanding by those skilled in the art. In addition, the drawings and subsequent descriptions are provided for those skilled in the art to fully understand the present application, and are not intended to limit the subject matter recited in the claims.

"Range" disclosed in the present application is defined in the form of lower limits and upper limits, and with a given range being defined by selecting a lower limit and an upper limit, the selected lower and upper limits define boundaries of a specific range. A range defined in this manner may be inclusive or exclusive of end values, and may be arbitrarily combined, that is, any lower limit may be combined with any upper limit to form a range. For example, if ranges of 60 to 120 and 80 to 110 are listed for a particular parameter, it is understood that ranges of 60 to 110 and 80 to 120 are also expected. Additionally, if the minimum range values 1 and 2 are listed, and if the maximum range values 3, 4, and 5 are listed, the following ranges are all contemplated: 1 to 3, 1 to 4, 1 to 5, 2 to 3, 2 to 4 and 2 to 5. In the present application, unless stated otherwise, the numerical range "a-b" represents an abbreviated representation of any combination of real numbers between a and b, where both a and b are real numbers. For example, the numerical range "0-5" means that all real numbers between "0-5" have been listed herein, and "0-5" is just an abbreviated representation of the combination of these numerical values. Additionally, when it is stated that a certain parameter is an integer of $\geq 2$, it is equivalent to disclosing that the parameter is, for example, an integer of 2, 3, 4, 5, 6, 7, 8, 9, 10, 11, 12, etc.

Unless otherwise specified, all embodiments and optional embodiments of the present application may be combined with each other to form new technical solutions.

Unless otherwise specified, all technical features and optional technical features of the present application may be combined with each other to form new technical solutions.

Unless otherwise specified, all steps of the present application may be performed sequentially or randomly, and in some embodiments sequentially. For example, the method comprises steps (a) and (b), meaning that the method may comprise steps (a) and (b) performed sequentially, or may comprise steps (b) and (a) performed sequentially. For example, the reference to the method may further comprise step (c), meaning that step (c) may be added to the method in any order, for example, the method may comprise steps (a), (b) and (c), or may comprise steps (a), (c) and (b), or may comprise steps (c), (a) and (b), and so on.

Unless otherwise specified, the terms "comprise", "comprising", "include" and "including" mentioned in the present application may be open-ended. For example, the "including" and "comprising" may indicate that it is possible to include or comprise other components not listed.

Unless otherwise specified, the term "or" is inclusive in the present application. By way of example, the phrase "A or B" means "A, B, or both A and B." More specifically, the condition "A or B" is satisfied by any one of the following conditions: A is true (or present) and B is false (or absent); A is false (or absent) and B is true (or present); or both A and B are true (or present).

In the process of studying a preparation process of a hole transport layer of a perovskite solar battery, the applicant found that in order to improve performance of the hole transport layer, it can be achieved by doping a nickel oxide thin-film as the hole transport layer with different elements. However, most of existing targets are single nickel oxide targets. If a doped nickel oxide thin-film is to be prepared, it is necessary to use a nickel oxide target and other targets to achieve by co-sputtering, in which the process is complicated, and doping elements in the obtained nickel oxide thin-film are also difficult to distribute uniformly, thereby limiting preparation of the doped nickel oxide thin-film and the improvement of electrical performances. In order to further improve performance of the hole transport layer to further improve performance of the perovskite solar battery, the present application provides a doped nickel oxide target used to prepare the hole transport layer of the perovskite solar battery.

In an embodiment of the present application, the present application provides a doped nickel oxide target, which includes a nickel oxide substrate and a dopant doped therein, the dopant including at least one compound that contains one or more elements of Cu, Ca, Cr, Sn, Hg, Pb, Mg, Mn, Ag, Co, and Pr.

Although the mechanism is not yet clear, the applicant unexpectedly found that when the doped nickel oxide target of the present application is used to prepare the hole transport layer of the perovskite solar battery, due to the compound doped with a specific element, the hole transport layer has a narrower band gap and higher spectral response, and battery conversion efficiency is significantly improved. Further, compared with co-sputtering and other methods, the method of using the doped nickel oxide target of the present application to prepare the hole transport layer can effectively improve a preparation process window of the doped hole transport layer, and is conductive to realizing process stability and consistency of thin films.

In some embodiments, the dopant includes at least one compound of CuO, $Cu_2O$, $Cu_2S$, CuI, CuSCN, $CuGaO_2$, CoO, $Cr_2O_3$, SnO, SnS, $Hg_2O$, PbO, AgO, $Ag_2O$, MnO, and $Pr_2O_3$.

The inventor found that when the dopant is a simple substance, because the simple substance and oxygen are prone to an incomplete reaction, the composition and doping ratio are not easy to control, and moreover, some simple substances such as Ga, Ag, Pb, I, and S are not easy to be powdered for plasma spraying. When the above compounds are directly doped into the nickel oxide substrate as a dopant, the composition and content are more controllable than those in doping with a single substance, and electrical performances of the perovskite solar battery using the hole transport hole prepared by the target are further improved.

In some embodiments, the dopant includes at least two compounds of CuO, $Cu_2O$, $Cu_2S$, CuI, CuSCN, $CuGaO_2$, CoO, $Cr_2O_3$, SnO, SnS, $Hg_2O$, PbO, AgO, $Ag_2O$, MnO, and $Pr_2O_3$. The inventor unexpectedly found that when at least two of the dopants are used for doping simultaneously, a prepared composite target contains various anions and cations of different valence states at the same time, so that a thin-film solar battery prepared therefrom has a larger regulation window of energy level structure, and is more convenient in energy level regulation, and photon conversion efficiency of the battery is further improved.

In some embodiments, the content of the dopant in the doped nickel oxide target is 0.1 wt % to 20 wt %. The inventor found that when the content of the dopant is within this range, it is conductive to improving performance of the prepared nickel oxide thin-film; if the content of the dopant is too much, for example, higher than 20 wt %, performance of the nickel oxide substrate will be reduced, which is not conductive to the improvement of overall performance.

In some embodiments, based on the total mass of the doped nickel oxide target, the content of CuO is 0 to 15%, the content of $Cu_2O$ is 0 to 15%, the content of $Cu_2S$ is 0 to 15%, the content of CuI is 0 to 20%, the content of CuSCN is 0 to 15%, the content of $CuGaO_2$ is 0 to 15%, the content of CoO is 0 to 8%, the content of $Cr_2O_3$ is 0 to 15%, the content of SnO is 0 to 15%, the content of SnS is 0 to 15%, the content of $Hg_2O$ is 0 to 15%, the content of PbO is 0 to 15%, the content of AgO is 0 to 15%, the content of $Ag_2O$ is 0 to 15%, the content of MnO is 0 to 10%, and the content of $Pr_2O_3$ is 0 to 15%; and the total content of the dopant is 0.1% to 20%. The inventor found that different dopants have different optimal content ranges for improving performance of the hole transport layer, and when the above compounds are doped into the nickel oxide target in the concentration ranges described in the present application, it is more conductive to improving performance of the hole transport layer.

In any of embodiments, the doped nickel oxide target is obtained by a classified plasma spraying method. In the doped nickel oxide target obtained by the method, the dopant is distributed inside the nickel oxide substrate more uniformly.

The classified plasma spraying described in the present application can be understood as respectively and separately spraying different materials, for example, nickel oxide and one or more dopants.

A second aspect of the present application provides a preparation method of a doped nickel oxide target, which includes:

thermally spraying a coating for binding on a back panel or back tube of a target, respectively introducing nickel oxide powder and various dopant powders into their respective plasma generation sprayers, and respectively applying the nickel oxide and dopant onto the back panel or back tube of the target by plasma spraying simultaneously, to obtain the doped nickel oxide target, wherein the dopant is selected from at least one compound that contains one or more elements of Cu, Ca, Cr, Sn, Hg, Pb, Mg, Mn, Ag, Co, and Pr.

In the doped nickel oxide target obtained by the method of the present application, the dopant is distributed more uniformly. In addition, the method of the present application can greatly increase a relative density of the target and reduce internal defects of the target, so that the obtained nickel oxide thin-film is more uniform, which is more conducive to the improvement of performance of the hole transport layer.

In addition, by using the method of the present application, the type and content of the dopant can be flexibly controlled, and a target doped with a suitable concentration and type of dopant can be directly prepared according to different performance requirements of the hole transport layer, so that the hole transport layer with the corresponding dopant type and content can be directly obtained through a sputtering process, thereby achieving convenience and accuracy of process adjustment.

Further, the preparation method provided by the present application has a simple process, strong controllability, and is convenient for rapid and efficient preparation and shaping in a wide range.

In some embodiments, the dopant is at least one compound selected from CuO, $Cu_2O$, $Cu_2S$, CuI, CuSCN, $CuGaO_2$, CoO, $Cr_2O_3$, SnO, SnS, $Hg_2O$, PbO, AgO, $Ag_2O$, MnO, and $Pr_2O_3$.

In some embodiments, the dopant includes at least two compounds selected from CuO, $Cu_2O$, $Cu_2S$, CuI, CuSCN, $CuGaO_2$, CoO, $Cr_2O_3$, SnO, SnS, $Hg_2O$, PbO, AgO, $Ag_2O$, MnO, and $Pr_2O_3$.

In some embodiments, the content of the dopant in the doped nickel oxide target is 0.1 wt % to 20 wt %.

In some embodiments, based on the total mass of the doped nickel oxide target, the content of CuO is 0 to 15%, the content of $Cu_2O$ is 0 to 15%, the content of $Cu_2S$ is 0 to 15%, the content of CuI is 0 to 20%, the content of CuSCN is 0 to 15%, the content of $CuGaO_2$ is 0 to 15%, the content of CoO is 0 to 8%, the content of $Cr_2O_3$ is 0 to 15%, the content of SnO is 0 to 15%, the content of SnS is 0 to 15%, the content of $Hg_2O$ is 0 to 15%, the content of PbO is 0 to 15%, the content of AgO is 0 to 15%, the content of $Ag_2O$ is 0 to 15%, the content of MnO is 0 to 10%, and the content of $Pr_2O_3$ is 0 to 15%; and the total content of the dopant is 0.1% to 20%.

A third aspect of the present application further provides use of the doped nickel oxide target provided in the first aspect of the present application or the doped nickel oxide target prepared by the method provided in the second aspect of the present application in preparation of a hole transport layer of a perovskite solar battery.

Examples of the present application will be described hereinafter. The examples described below are exemplary and only used to explain the present application, and should not be construed as a limitation on the present application. Where specific techniques or conditions are not specified in the examples, the techniques or conditions described in the literatures of the art or the product specifications are followed. Where manufacturers are not specified, the reagents or instruments used are conventional products and are commercially available.

Example 1

(1) A back panel was fixed to a holder of a plasma spraying device, and a layer of indium coating (binding material) for binding, with a thickness of 1.3 mm, was thermally sprayed on the back panel.

(2) A powdered nickel oxide substrate and a dopant AgO were respectively added to different plasma powder spraying material chambers of a powder plasma spraying box, so that different materials were separately added, respectively.

The binding material of the back panel was heated at 200° C., and then plasmas of the dopant and nickel oxide substrate powder were sprayed onto the heated binding material through respective nozzles. Reference process parameter range was as follows: plasma power of 15 KW, angle of 40°, and temperature of the back panel ranging from room temperature to 200° C. Deposition and mixing on the back panel were carried out by means of the nozzles forming an included-angle coverage to achieve a uniform doping effect. By controlling the spraying amount of the corresponding nozzle, the doping amount of AgO was controlled to be 0.5 wt %.

With continuous performing of plasma spraying, a doped nickel oxide material on the back panel was thickened continuously. After the thickness reached a set value of 16 mm, the spraying device stopped plasma spraying to obtain an AgO-doped nickel oxide target.

(3) The back panel of the target was removed to be subjected to laser cutting and trimming, the outer part of the edge the target was cut and recovered, and the edge was trimmed to form a target mounting edge, so that the basic secondary processing of the target was completed, and then the target was subjected to surface cleaning.

Example 2

Except that the doping amount of AgO was adjusted to 1 wt %, the rest were the same as in Example 1.

Example 3

Except that the doping amount of AgO was adjusted to 2 wt %, the rest were the same as in Example 1.

Example 4

Except that the dopant in step (2) was adjust to CuI and the doping amount of CuI was controlled to be 20 wt %, the rest were the same as in Example 1.

Example 5

In addition to step (2), the powdered nickel oxide substrate and dopants $CuGaO_2$ and SnS were respectively added to three different plasma powder spraying material chambers of the powder plasma spraying box, so that the different materials of the oxidized nickel substrate, $CuGaO_2$ and SnS were separately added, respectively; the doping amounts of $CuGaO_2$ and SnS were controlled to be 5 wt % respectively; and the rest were the same as in Example 1.

Comparative Example 1

Commercially available nickel oxide target.
Preparation of Perovskite Solar Battery
Step 1: An ITO conductive glass substrate was cleaned and dried by blowing, and then subjected to an ultraviolet light cleaning treatment to obtain a pretreated base substrate.
Step 2: The pretreated base substrate and the doped nickel oxide targets of Examples 1 to 5 or the nickel oxide target of Comparative Example 1 were moved into a high-vacuum sputtering system, and a hole transport layer was sputtered on the pretreated base substrate. The specific conditions are as follows:
Oxygen was introduced as a working gas, a gas flow rate was 200 sccm; a sputtering pressure was $2.3 \times 10^{-3}$ mbar, a distance between the target and the base substrate was 79.5 mm, a sputtering power was 200 W, a heating temperature was 125° C., and a layer of doped nickel oxide thin-film with a thickness of 25 nm was deposited by sputtering as a hole transport layer.

Step 3: A perovskite precursor solution was spin-coated on the hole transport layer, then a chlorobenzene solvent was added to continue spin-coating, and annealing at 100° C. was performed to obtain a perovskite crystal thin-film, that is, a light absorption layer.
Step 4: A chlorobenzene solution of PCBM ([6,6]-phenyl-C61-isomethyl butyrate) was spin-coated on the light absorption layer to form an electron transport layer.
Step 5: A metal electrode material silver-aluminum alloy was evaporated onto the electron transport layer by thermal evaporation under vacuum to obtain a perovskite solar battery.
Test Methods:
Test of Energy Band Distribution:
Energy band distribution of the hole transport layer of the perovskite solar battery was tested by an X-ray photoelectron spectrometer (XPS), model Escalab 250Xi (from Thermo Scientific), to obtain the valence band maximum (CBM value), conduction band minimum (VBM value), and energy band gap ($\Delta Eg$).
Test of Spectral Response:
A spectral curve of the hole transport layer of the perovskite solar battery was measured by a Thermo Fisher Scientific iS 50 infrared spectrometer.
Energy band distribution results of the hole transport layers of perovskite solar batteries prepared using the doped nickel oxide targets prepared in Examples 1 to 3 and the nickel oxide target in Comparative Example 1 of the present application are shown in Table 1. Conversion efficiency results of the perovskite solar batteries prepared from the targets of various example and the comparative example are shown in Table 2.
The spectral curves of the hole transport layers of perovskite solar batteries prepared from the targets of Example 1 and Comparative Example 1 are shown in FIG. 1. It can be seen from FIG. 1 that the hole transport layer prepared using the doped nickel oxide target of the present application has higher transmittance for incident light of different wavelengths, indicating that the hole transport layer prepared using the doped nickel oxide target of the present application has a higher spectral response.

TABLE 1

| Number of samples | CBM (eV) | VBM (eV) | $\Delta Eg$ (eV) |
|---|---|---|---|
| Comparative Example 1 | −1.31 | −5.14 | 3.83 |
| Example 1 | −1.38 | −5.20 | 3.82 |
| Example 2 | −1.44 | −5.26 | 3.80 |
| Example 3 | −1.51 | −5.30 | 3.79 |

TABLE 2

| Number of samples | Short-circuit current Isc(mA) | Short-circuit current density Jsc(mA · cm$^{-2}$) | Voltage at open circuit Voc (V) | Voltage at open circuit/battery (Voc/Cell) | Fill factor(%) | Photon-to-electron conversion efficiency(%) | Area (cm$^2$) |
|---|---|---|---|---|---|---|---|
| Example 1 | 114.10 | 21.39 | 12.33 | 1.03 | 69.24 | 15.22 | 64 |
|  | 113.65 | 21.31 | 12.64 | 1.05 | 68.69 | 15.42 | 64 |
| Example 2 | 115.29 | 21.62 | 11.87 | 0.99 | 69.55 | 14.87 | 64 |
|  | 115.04 | 21.57 | 12.34 | 1.03 | 68.87 | 15.28 | 64 |
| Example 3 | 114.40 | 21.45 | 12.09 | 1.01 | 72.01 | 15.57 | 64 |
|  | 114.27 | 21.43 | 12.38 | 1.03 | 70.56 | 15.59 | 64 |

TABLE 2-continued

| Number of samples | Short-circuit current Isc(mA) | Short-circuit current density Jsc(mA · cm$^{-2}$) | Voltage at open circuit Voc (V) | Voltage at open circuit/battery (Voc/Cell) | Fill factor(%) | Photon-to-electron conversion efficiency(%) | Area (cm$^2$) |
|---|---|---|---|---|---|---|---|
| Example 4 | 114.45 | 21.46 | 12.04 | 1.00 | 71.96 | 15.49 | 64 |
|  | 114.35 | 21.44 | 12.33 | 1.03 | 70.78 | 15.59 | 64 |
| Example 5 | 113.87 | 21.35 | 12.25 | 1.02 | 72.21 | 15.74 | 64 |
|  | 113.35 | 21.25 | 12.64 | 1.05 | 71.50 | 16.01 | 64 |
| Comparative | 90.81 | 17.03 | 12.07 | 1.01 | 72.52 | 12.42 | 64 |
| Example 1 | 90.63 | 16.99 | 12.44 | 1.04 | 71.32 | 12.57 | 64 |

It can be seen from Table 1 that the hole transport layers prepared from the doped nickel oxide targets of Examples 1 to 3 have narrower energy band gap, indicating that the hole transport layer of the present application has a larger light absorption range.

It can be seen from Table 2 that the short-circuit current and short-circuit current density as well as the photon-to-electron conversion efficiency of the battery using the hole transport layer prepared from the doped nickel oxide target of each example of the present application are significantly improved, and particularly, photon-to-electron conversion efficiency of a composite doped hole transport layer is further improved, indicating that electrical performances of the perovskite solar battery including the hole transport layer prepared using the doped nickel oxide target of the present application are significantly improved.

The above descriptions are merely some examples of the present application, and are not intended to limit the present application. Any modifications, equivalent replacements, improvements, etc. made within the spirit and principle of the present application shall be included within the scope of protection of the present application.

What is claimed is:

1. A doped nickel oxide target, comprising:
a nickel oxide substrate; and
a dopant doped in the nickel oxide substrate, the dopant comprising at least one compound that contains one or more elements of Ca, Sn, Pb, and Pr, and the dopant comprising at least one compound of SnO, SnS, PbO, and Pr$_2$O$_3$.

2. The doped nickel oxide target according to claim 1, wherein a content of the dopant in the doped nickel oxide target is 0.1 wt % to 20 wt %.

3. The doped nickel oxide target according to claim 1, wherein the dopant comprises at least two compounds of SnO, SnS, PbO, and Pr$_2$O$_3$.

4. The doped nickel oxide target according to claim 1, wherein based on a total mass of the doped nickel oxide target:

a content of SnO is 0 to 15%, a content of SnS is 0 to 15%, a content of PbO is 0 to 15%, and a content of Pr$_2$O$_3$ is 0 to 15%; and
a total content of the dopant is 0.1% to 20%.

5. The doped nickel oxide target according to claim 1, wherein the dopant comprises at least one compound that contains one or more elements of Pb and Pr.

6. A preparation method of a doped nickel oxide target, comprising:

thermally spraying a coating for binding on a back panel or a back tube of a target;
introducing nickel oxide powder and dopant powders into respective plasma generation sprayers; and
simultaneously applying nickel oxide and dopant onto the back panel or the back tube of the target by plasma spraying, to obtain the doped nickel oxide target;
wherein the dopant comprises at least one compound that contains one or more elements of Ca, Sn, Pb, and Pr.

7. The method according to claim 6, wherein a content of the dopant in the doped nickel oxide target is 0.1 wt % to 20 wt %.

8. The method according to claim 6, wherein the dopant comprises at least one compound selected from SnO, SnS, PbO, and Pr$_2$O$_3$.

9. The method according to claim 8, wherein the dopant comprises at least two compounds selected from SnO, SnS, PbO, and Pr$_2$O$_3$.

10. The method according to claim 8, wherein based on a total mass of the doped nickel oxide target:

a content of SnO is 0 to 15%, a content of SnS is 0 to 15%, a content of PbO is 0 to 15%, and a content of Pr$_2$O$_3$ is 0 to 15%; and
a total content of the dopant is 0.1% to 20%.

11. A doped nickel oxide target, comprising:
a nickel oxide substrate; and
a dopant doped in the nickel oxide substrate, the dopant comprising at least one compound that contains one or more elements of Ca, Sn, Hg, Pb, Ag, Co, and Pr, and the at least one compound comprising a metal sulfide.

*     *     *     *     *